(12) United States Patent
Cheo

(10) Patent No.: US 6,724,261 B2
(45) Date of Patent: Apr. 20, 2004

(54) ACTIVE RADIO FREQUENCY CAVITY AMPLIFIER

(75) Inventor: Bernard R. Cheo, Teaneck, NJ (US)

(73) Assignee: Aria Microwave Systems, Inc., Teaneck, NJ (US)

( * ) Notice: Subject to any disclaimer, the term of this patent is extended or adjusted under 35 U.S.C. 154(b) by 28 days.

(21) Appl. No.: 09/903,892

(22) Filed: Jul. 12, 2001

(65) Prior Publication Data

US 2002/0105383 A1 Aug. 8, 2002

Related U.S. Application Data

(60) Provisional application No. 60/255,276, filed on Dec. 12, 2000.

(51) Int. Cl.[7] ............................... H03F 3/60; H01P 5/12
(52) U.S. Cl. ......................... 330/295; 333/125; 333/137
(58) Field of Search ................................. 330/295, 286; 333/125, 137

(56) References Cited

U.S. PATENT DOCUMENTS

| | | | |
|---|---|---|---|
| 3,733,560 A | 5/1973 | Oltman, Jr. et al. ........... 330/34 |
| 3,775,694 A | 11/1973 | Quine ........................... 330/56 |
| 4,103,262 A | 7/1978 | Woodward | |
| 4,124,823 A | 11/1978 | Sechi ............................. 330/56 |
| 4,189,683 A | * 2/1980 | Fassett et al. ............. 330/295 X |
| 4,251,784 A | 2/1981 | Luetzelschwab et al. ... 333/127 |
| 4,429,286 A | * 1/1984 | Nichols et al. ............... 330/286 |
| 4,453,139 A | 6/1984 | Labaar ......................... 331/47 |
| 4,562,409 A | * 12/1985 | Saito et al. ................. 330/295 |
| 4,647,869 A | 3/1987 | Kaneko et al. ............. 330/286 |
| 4,686,494 A | * 8/1987 | Kaneko et al. ............. 330/295 |
| 4,700,145 A | 10/1987 | Yelland et al. .............. 330/286 |
| 4,707,668 A | 11/1987 | Hoffert ......................... 330/56 |
| 4,812,782 A | 3/1989 | Ajioka ......................... 330/286 |
| 4,825,175 A | 4/1989 | Tsuda et al. ................. 330/286 |
| 4,931,747 A | * 6/1990 | Hom ....................... 330/295 X |
| 5,119,051 A | * 6/1992 | Myer .......................... 330/295 |
| 5,121,083 A | 6/1992 | Bauer et al. ................. 330/295 |
| 5,497,050 A | 3/1996 | Cheo ........................... 315/5.41 |

FOREIGN PATENT DOCUMENTS

| | | | |
|---|---|---|---|
| EP | 0 345 006 | 12/1989 | |
| EP | 0 493 081 | 7/1992 | |
| FR | 2083888 | 12/1971 | |
| GB | 2 126 032 A | 3/1984 | |
| JP | 55-147011 | 11/1980 | |
| JP | 178807 | * 10/1984 | .......... 330/295 |
| JP | 85601 | * 5/1985 | .......... 333/125 |

OTHER PUBLICATIONS

International Search Report PCT/US01/45591.
*Phermex Standing-Wave Linear Electron Accelerator*, by T. P. Starke, IEEE Transactions on Nuclear Science, vol. NS–30, No. 2, Apr. 1983.

* cited by examiner

Primary Examiner—Benny Lee
(74) Attorney, Agent, or Firm—Carter, Deluca, Farrell & Schmidt LLP

(57) ABSTRACT

An active radio frequency cavity amplifier (ARFCA) is provided having a housing defining an input cavity and an output cavity; a plurality of transistors mounted to said housing, each of the plurality of transistors having an input lead and an output lead; a first RF power coupling mechanism disposed within the housing in proximity to the input cavity for coupling RF power from a source into the input cavity to generate an RF field; a first conducting assembly having a plurality of conductors each configured to contact a respective input lead of each of the plurality of transistors for coupling the RF field in the input cavity to the input leads of the plurality of transistors; a second conducting assembly having a plurality of conductors each configured to contact a respective output lead of the plurality of transistors for coupling the amplified RF power from the output leads of the plurality of transistors to the output cavity; and a second RF power coupling mechanism disposed within the housing in proximity to the output cavity for coupling amplified RF power from the output cavity to a load.

12 Claims, 3 Drawing Sheets

ACTIVE RADIO FREQUENCY CAVITY AMPLIFIER

PRIORITY

This application claims priority to an application entitled "ACTIVE RADIO FREQUENCY CAVITY AMPLIFIER" filed in the United States Patent and Trademark Office on Dec. 12, 2000 and assigned Ser. No. 60/255,276, the contents of which are hereby incorporated by reference.

BACKGROUND OF THE INVENTION

1. Field of the Invention

This invention relates to radio frequency (RF) electromagnetic (EM) field resonant cavities, and more particularly to such cavities in which high RF power output is to be achieved.

2. Description of the Related Art

It is known to generate high frequency EM fields in a cavity for the purpose, e.g., of accelerating a charged particle beam in a radio frequency (RF) accelerator, such as a linear accelerator. In a typical construction of a linear accelerator, RF power is provided by a number of vacuum tube amplifiers operating at a high voltage (tens of kilovolts or higher) and the amplified RF power is transmitted from the RF tubes to the cavity by means of a coaxial cable, or the like, to form an oscillating EM field inside the cavity. One common type of linear accelerator (linac), the drift tube linac (DTL), has a series of drift tubes which are arranged within the cavity so that the particles are accelerated by the electric field to form the desired particle beam.

There are a number of applications or potential applications for which relatively light-weight and easily transportable RF cavities or linacs would be desirable. These applications include earth-orbit based applications; decentralized, on-demand production of medical isotopes; and high-power RF amplifiers, among others. However, the substantial weight and size of the necessary RF tubes, high voltage power supply and power conditioning equipment, and associated components, has been a significant deterrent to use of RF cavities or linacs for these purposes.

One proposed solution to overcome the disadvantages of the above-mentioned RF cavities is shown and described in U.S. Pat. No. 5,497,050 issued to Bernard R. Cheo on Mar. 5, 1996. FIG. 4 of U.S. Pat. No. 5,497,050, reproduced in this application as FIG. 1, shows an RF cavity 110 defined by a wall 112, which has a conductive inner surface 114. The wall 112 is divided into upper and lower cylindrical sections 120 and 122 and installed between the sections is an annular array 124 of solid state power amplifier modules 126. Each module 126 has an input terminal which is connected to a source of a relatively low power RF driving signal. A positive d.c. terminal 140 is connected to the upper section 120 at an outer surface, and similarly, a negative d.c. terminal 146 is connected to the lower section 122 via a quarter-wavelength choke connection. When used as an amplifier, the RF cavity 110 includes a waveguide 160, or alternatively, a coaxial cable output connector, for taking out high power EM waves from the cavity 110.

In operation, the RF driving input power applied to the terminals of the amplifier modules 126 is at a frequency that corresponds to that of the desired resonant mode of cavity 110. Under control of the input drive amplifier modules 126 induce a large RF current, with a peak amplitude on the order of several kiloamps, to flow at inner surface 114 of wall 112, so that the desired EM field amplitude is established. Due to skin effect, this current flows along the inside surface of the cavity wall to a depth on the order of few microns. The d.c. power supply output current which passes through the modules flows through the bulk of wall 112. The amplifier modules 126, which are low impedance devices, operate at high-current/low-voltage, while a particle beam generated along an axis of cavity 110 is at high-voltage/low-current, representing a high impedance load. Thus, the RF cavity 110 disclosed serves at once as a power combiner and a matching transformer for the amplifier modules 126.

Due to its construction, a minimal amount of packaging is required within the modules 126, because the wall 112 of cavity 110 serves as a heat sink for the transistors. The system's total cooling budget is not increased, while most of the packaging, which makes up the heaviest part of a transistor RF power system, is eliminated. Additionally, since the vacuum tubes required for conventional RF linear accelerators are not required to be provided with accelerator cavity 110, the break-down problems of high voltage equipment in earth orbit are eliminated. Further, the power supply of the cavity 110 avoids the RF power transmission loss of conventional accelerators, thereby achieving higher efficiency.

While the cavity disclosed in U.S. Pat. No. 5,497,050 is highly effective for use as a linear accelerator, it lacks the structure for efficient operation as an amplifier. First, the cavity disclosed only shows a waveguide as the cavity's output port with no mention of an input port for receiving the RF power which is to be amplified. Second, for any radio frequency device involving a resonant cavity, it is necessary that frequency tuning can be performed in order that it can operate properly and at the desired frequency. The prior art RF cavity disclosed by U.S. Pat. No. 5,497,050 neither addresses nor shows any means by which tuning can be achieved when acting as an amplifier.

SUMMARY OF THE INVENTION

Accordingly, it is an object of the present invention to provide a high-power RF cavity that can easily be transformed into an efficient high-power amplifier.

It is another object of the present invention to provide a high-power amplifier with discrete input and output ports.

It is a further object of the invention to provide a high-power amplifier with frequency tuning capabilities.

According to the present invention, the foregoing objects are met by the provision of an active radio frequency cavity amplifier (ARFCA). The ARFCA includes a housing defining two independently tunable resonant cavities. Each cavity is generally cylindrical and includes conductive walls. Conductive structures in a first cavity, i.e., an input cavity, couple an RF field within the input cavity to input leads of a plurality of power transistors formed in an annular array. Similarly, conductive structures in a second cavity, i.e., an output cavity, couple an RF field within the output cavity to output leads of the plurality of power transistors.

A plunger assembly is provided for the input cavity for coupling low RF power from a source into the input cavity. A plunger assembly is also provided for the output cavity for coupling the amplified RF power out to a load. The plunger assembly of each cavity further serves as a mechanism for tuning the cavities to resonate at the desired operating frequency.

The ARFCA in accordance with the present invention is a relatively low weight device, using a low voltage DC power source for the RF power transistors. The input cavity functions as a power distributor and matching transformer to the input of a large number of RF power transistors. The output cavity serves as the power combiner and the matching transformer from the output of the same transistors. The walls of the cavities can serve as a heat sink. High combining efficiency is achieved.

According to an aspect of the invention, the combination of transistors in the ARFCA is accomplished in one step, and therefore, there is no accumulation of losses and phase errors through stages as in conventional cascaded multiple stage approaches for combining large number of devices. Furthermore, each cavity is inherently less lossy than the stripline structures used in conventional approaches, and as a result, the efficiency and gain of the ARFCA can approach that of the individual transistors used.

According to another aspect of the invention, the ARFCA requires no vacuum and has no complex electrodes, circuits or windows, and therefore, various parts of the structure can be mass-produced by standard Computer Numeric Control (CNC) machines. Additionally, since combining and impedance matching is accomplished with the cavities, the ARFCA requires no other discrete passive electronic components in its RF circuitry, and as a result, the ARFCA's reliability is increased.

BRIEF DESCRIPTION OF THE DRAWINGS

The above and other objects, features and advantages of the present invention will become apparent from the following detailed description when taken in conjunction with the accompanying drawings in which.

DETAILED DESCRIPTION OF PREFERRED EMBODIMENTS

A preferred embodiment of the present invention will be described hereinbelow with reference to the accompanying drawings. In the following description, well-known functions or constructions are not described in detail since they would obscure the invention in unnecessary detail.

Figure 1:
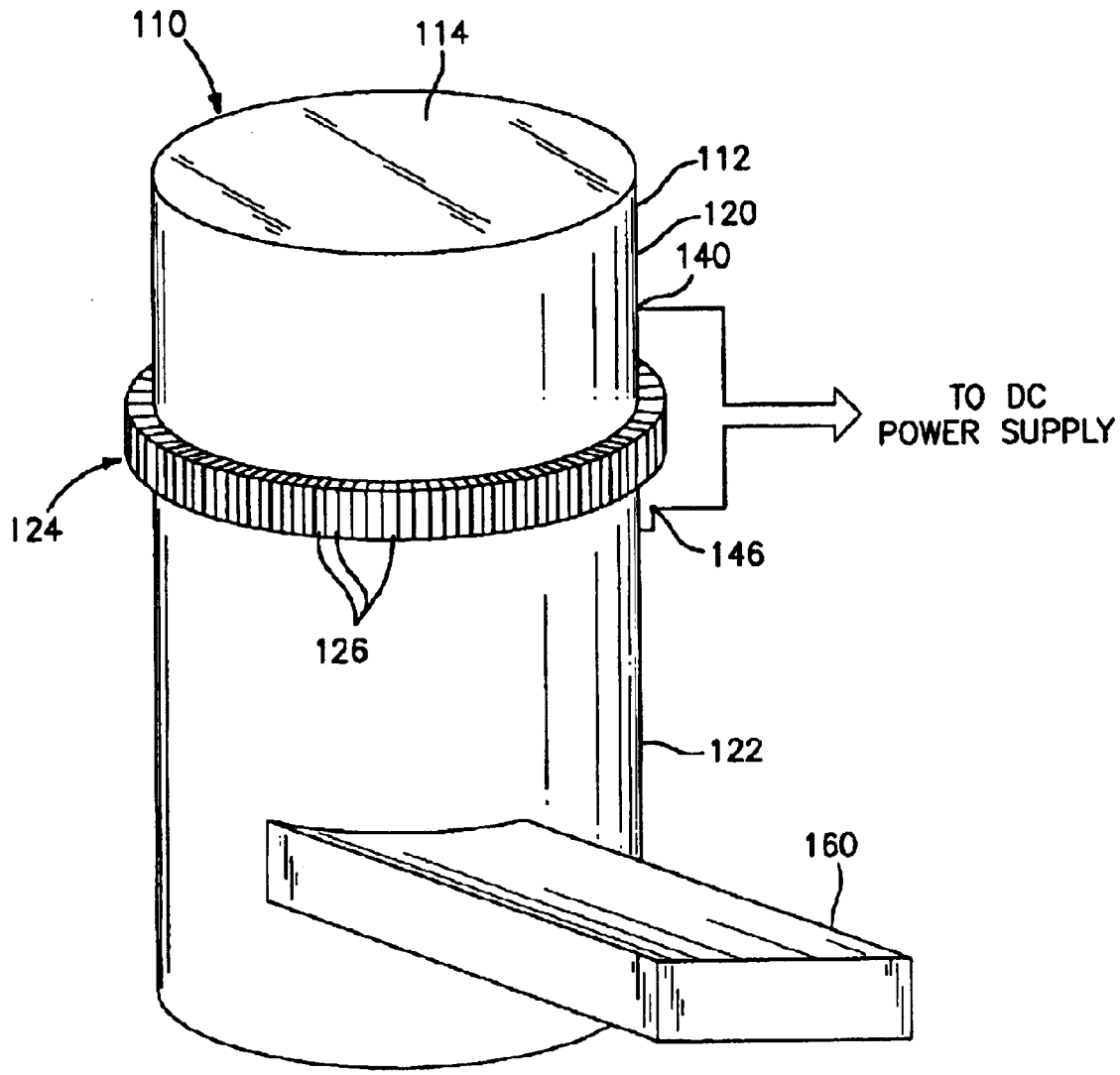
FIG. 1 is a perspective view of a prior art radio frequency cavity.
Figure 2:
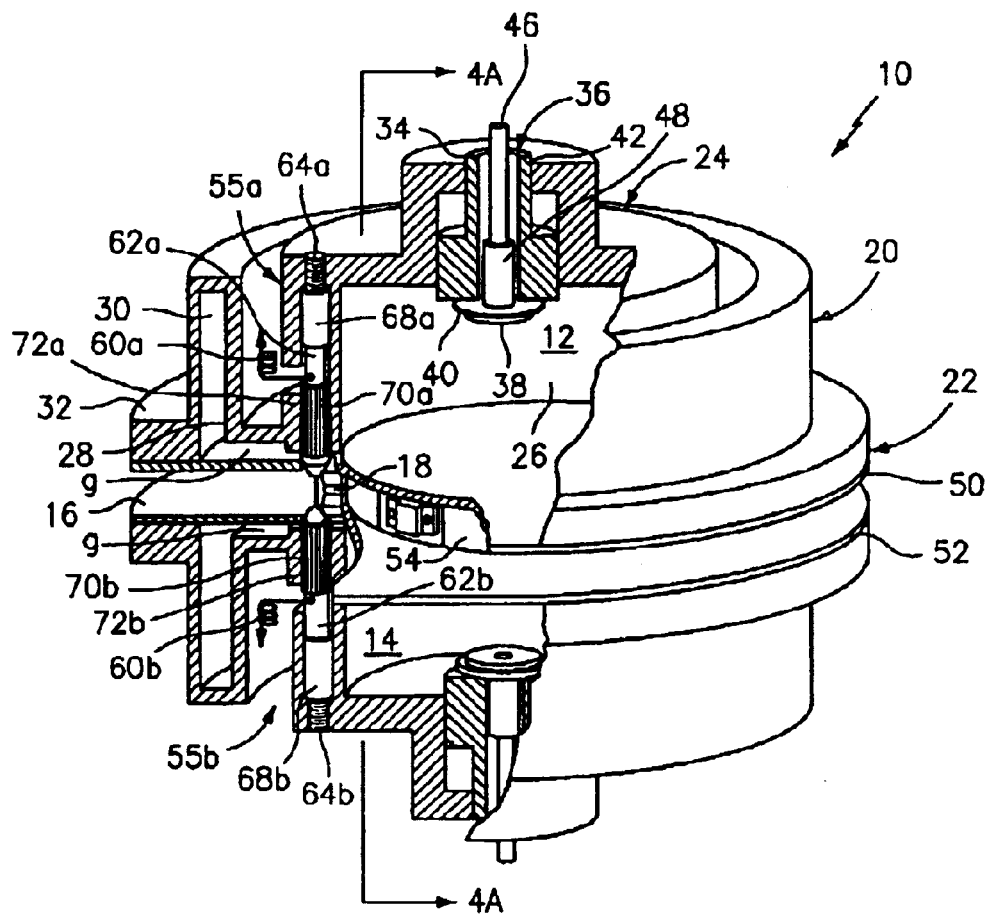
FIG. 2 is a perspective view, partially broken away, of an active radio frequency cavity amplifier (ARFCA) in accordance with the present invention.

Referring to the FIG. 2, an active radio frequency cavity amplifier (ARFCA) of the present invention is designated by the reference numeral 10. The ARFCA includes two independently tunable resonant cavities 12, 14 (see FIGS. 2 and 4A). The cavities 12, 14 are mated together by a center plate 16 on which a plurality of transistors 18 are mounted. The cavity 12 is coupled to input leads of the plurality of transistors 18, and thus, is referred to as the input cavity. Similarly, the cavity 14 is coupled to output leads of the plurality of transistors 18 and likewise is referred to as the output cavity.

As illustrated by FIG. 2, the two cavities 12, 14 are substantially symmetrically identical for maintaining a resonant RF field therein, except they generally require different matching due to the difference of impedance matching needed for the transistor input and output. For simplicity purposes, only the structure of the input cavity 12 is described in detail hereinbelow, since the structure of the output cavity 14 is similar to the structure of the input cavity 12.

The first cavity 12 is defined by a generally cylindrical housing 20 having an open end 22, a closed end 24, and the center plate 16. The cavity 12 is bound by a first cylindrical wall 26 within the cylindrical housing 20. A second cylindrical wall 28 formed with an annular cavity 30 defined by housing 20 surrounds wall 26 to act as RF choke to prevent the RF input to the transistors 18 from being short-circuited during operation. It is contemplated that other types of structures for the second cylindrical wall 28 can be used to act as the RF choke, such as having the second cylindrical wall 28 extend outward from the wall 26 without being bent to vertical.

The lower portion of wall 28 includes an annular rim 32 for connecting the open end 22 of housing 20 to the center plate 16. The cylindrical housing 20 is constructed from conductive materials, such as copper or aluminum, or any other conductive or superconductive materials known in the art.

Figure 4C:
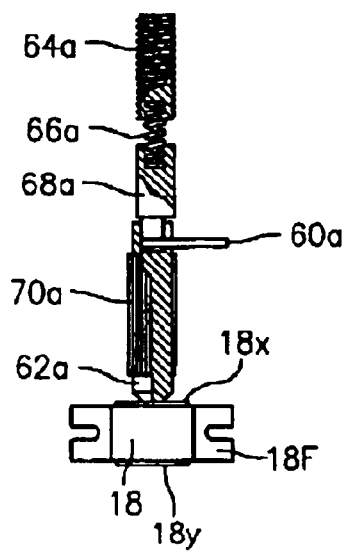
FIG. 4C is a side elevational view of an upper coupling mechanism in accordance with the present invention.
Figure 4A:
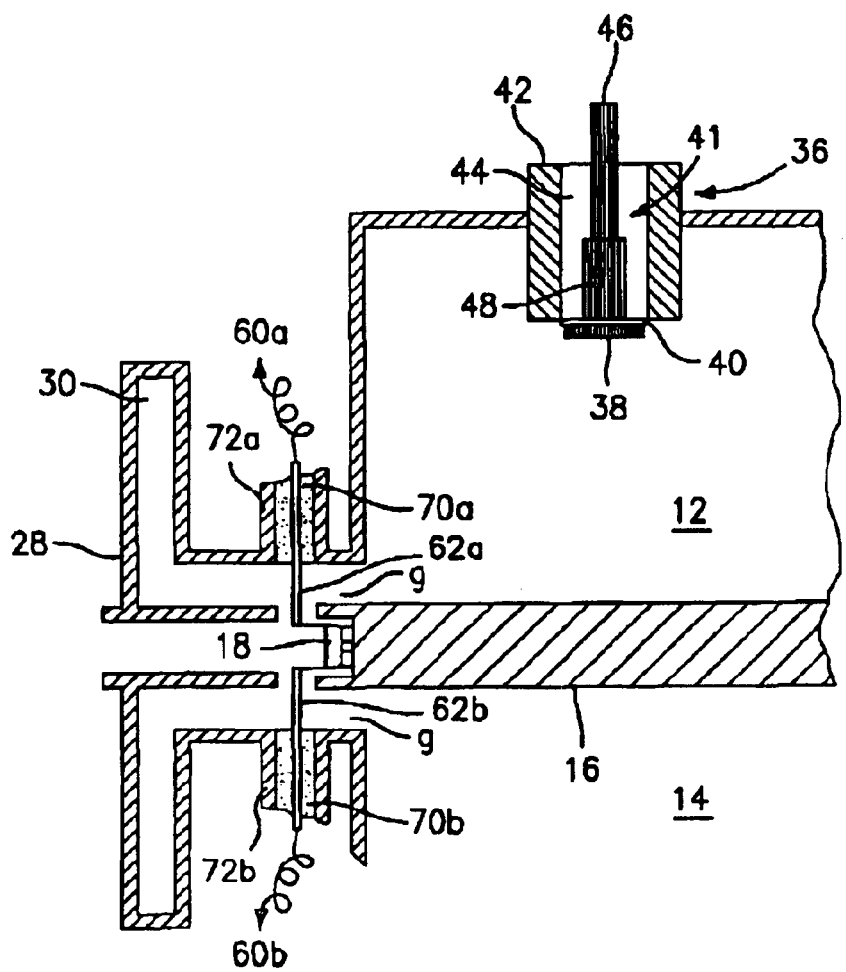
FIG. 4A is a partial schematic diagram of the ARFCA as seen along line 4A—4A of FIG. 2.

The closed end 24 of housing 20 defines an aperture 34 for placement of a plunger assembly 36 therein. The plunger assembly 36 includes a conducting circular disc 38, a dielectric disc 40, and a conducting cylindrical plunger 42 which collectively acts as a coupling capacitor. With reference to FIG. 4A, there is shown a schematic block diagram of the plunger assembly 36. The plunger assembly 36 further includes a coaxial section 41 formed by channel 44 and center conductor 46 including a matching section 48 for inputting and/or outputting RF power, e.g., the low input RF power and the amplified input RF power, to and from the active radio frequency amplifier 10. That is, structures 38, 40, 42, and 46 of the first or input cavity 12 couple low RF power from the external source into the first cavity 12, and the same structures of the second or output cavity 14 couple the amplified RF power out to the load.

Returning to FIG. 2, each plunger assembly 36 is movable within its respective aperture 34. The plunger assemblies 36 are moved either manually or via threaded screws until the desired resonant frequency is reached. It is contemplated that the amount of movement into the apertures 34 of each plunger assembly 36 is approximately known in advance for the desired operating frequency.

The center plate 16 is generally circular and includes an upper annular plate 50 for defining the boundary of the first cavity 12 and a lower annular plate 52 for defining the boundary of the second cavity 14. The upper and lower annular plates 50, 52 are joined by a circular structure 54 upon which are disposed the plurality of transistors 18 as a circular array.

Figure 3:
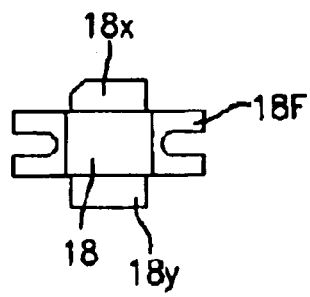
FIG. 3 is a top plan view of a generic transistor package used in the ARFCA of FIG. 2.

FIG. 3 is a top plan view of a generic transistor package preferably used for the plurality of transistors 18. The table below identifies, with respect to the particular transistor type, its two leads 18x and 18y, and its mounting flange 18F, which is electrically common to both input and output, and also conducts the heat generated internally by the transistor 18 to the walls of cavities 12, 14 (FIG. 2), which serve as a heat sink.

|  | BJT: COMMON BASE | BJT: COMMON EMITTER | FET |
| --- | --- | --- | --- |
| 18x | COLLECTOR | COLLECTOR | DRAIN |
| 18y | EMITTER | BASE | GATE |
| 18F | BASE | EMITTER | SOURCE |

In operation, d.c. power is applied to the transistor leads 18x and 18y through a normal wire lead 60a (FIGS. 2 and 4C) via a conducting rod 62a (FIG. 2). Since the d.c. power is applied to each of the plurality of transistors 18, it is possible to use elements, such as ferrite beads (not shown), in the drain or collector power supply circuit of each transistor 18 to ensure its stable operation.

Bias voltages applied to each input lead 18x (FIG. 4C) can be adjusted independently to provide a means to deal with the problems caused by the lack of uniformity among the transistors used. The housing 20 and the center plate 16 are at d.c. ground potential to ensure safety in the operation of the ARFCA 10 as shown in FIG. 2. FIG. 4C additionally shows a means of maintaining contact, between the conducting rod 62 and a respective transistor input lead 18x by pressure exerted on the rod 62 by an upper coupling mechanism 55a see (FIG. 2) having a screw 64, spring 66a, and an insulating section 68. It is noted that an upper coupling mechanism 55a (FIG. 2) is provided for each of the plurality of transistors 18. If so desired, contacts may also be maintained by soldering the rods 62a, 62b to the transistor leads 18x, 18y.

Similarly, pressure is exerted on a conducting rod 62b by a lower coupling mechanism 55b having a similar structure as the upper coupling mechanism 55b. That is, lower coupling mechanism 55b includes a conducting rod 62b, which is in contact with a respective transistor output lead 18y, by a coaxial coupling capacitor formed by the conducting rod 62b, a dielectric sleeve 70b, and an outer conductor 72b through a gap "g" at the base of the output cavity 14 to couple the output RF power of each of the transistor 18 to the output cavity 14 via the conducting rod 62b. The combined output RF power from all the transistors is greater than the input RF power from the source, since each of the plurality of transistors 18 amplifies the input RF power. It is noted that a lower coupling mechanism 55b is provided for each of the plurality of transistors 18.

Figure 4B:
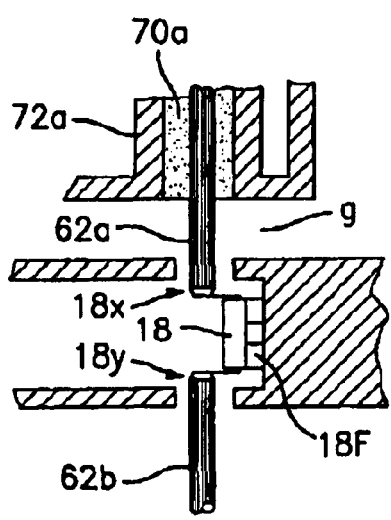
FIG. 4B is an enlarged partial view of FIG. 4A illustrating the coupling of the conducting rods of the input/output cavities of the ARFCA to a transistor.

In other words, with reference to FIG. 4A which illustrates a partial schematic diagram of the ARFCA 10 as seen along line 4A—4A of FIG. 2 and FIG. 4B which showns an enlarged partial view of FIG. 4A illustrating the coupling of the conducting rods 62a, 62b of the input and output cavities 12, 14 of the ARFCA 10 to a respective transistor 18, at each transistor 18, structures 62a, 70a and 72a (all three elements shown by FIGS. 4A and 4B see also FIG. 4C which also shows elements 62a and 70a) or the coaxial coupling capacitor of the input cavity 12 couple the RF field in the input cavity 12 to the transistor's input leads 18x (FIG. 4B), and structures 62b, 70b and 72b (all three elements shown by FIG. 4A) or the coaxial coupling capacitor of the output cavity 14 couple the RF field in the output cavity 14 to the transistor's output leads 18y (FIG. 4B). As shown by FIGS. 4A and 4B, one end of the conducting rod 62a exits structure 70a and is coupled to input lead 18x in proximity to the gap "g", and one end of the conducting rod 62b is coupled to output lead 18y in proximity to the other gap "g".

In low frequency applications, a lumped chip capacitor may be used instead of the coaxial coupling capacitor. The RF field in the desired cavity mode, e.g., the $TM_{010}$ mode, is coupled out from the cavity 14 to the load via the components of the coupling capacitor of the plunger assembly 36 of the output cavity 14. These components include the conducting circular disc 38, the dielectric disc 40, and the bottom face of the conducting cylindrical plunger 42.

As stated above, each plunger assembly 36 functions to tune the resonant frequency of its respective cavity by varying the depth of penetration of the plunger 42 into the respective cavity. The depth can be varied manually or automatically by providing an automated control mechanism. The coaxial section 41 formed by channel 44 of the plunger assembly 36, and the center conductor 46, including the matching section 48, then couples the amplified RF power out through a standard coaxial connector.

At the input side, the direction of flow of the RF power is reversed from that of the output side: from the input connector mounted on the plunger assembly 36 through the coaxial channel and the coupling capacitor, the RF power reaches the input leads 18x of the transistors 18 through the gap "g" at the base of the input cavity 12 and the components 62a, 70a and 72a of the coaxial coupling capacitor. The components of the output cavity 14 which correspond to those of the input cavity 14 are similar in structure and serve similar purposes.

It should be understood that most of the conductive components of the ARFCA are in good thermal contact with one another, and hence, thermally become one unit body. Cooling fins may be installed for effective forced air cooling. Alternatively, liquid cooling can be readily implemented by creating coolant channels in the center plate or elsewhere in the conductive housing.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An active radio frequency cavity amplifier comprising:

a housing defining an input cavity, an output cavity and at least one gap for each of the input and output cavities;

a plurality of transistors mounted to said housing, each of said plurality of transistors having a respective input lead and a respective output lead;

a first RF power coupling mechanism disposed within the housing in proximity to the input cavity for coupling RF power from a source into the input cavity to generate an RF field;

a first conducting assembly having a plurality of conductors, each conductor configured to contact a respective input lead of the plurality of transistors for coupling the RF field in the input cavity to the respective input leads of the plurality of transistors via the at least one gap of the input cavity;

a second conducting assembly having a plurality of conductors, each conductor configured to contact a respective output lead of the plurality of transistors for inducing an amplified RF field in the output cavity from said plurality of transistors via the at least one gap of the output cavity; and a second RF power coupling mechanism disposed within the housing in proximity to the output cavity for coupling amplified RF power from the amplified RF field in the output cavity to a load, wherein each of said first and second RF power coupling mechanisms include a respective plunger assembly having a corresponding plunger configured to move within said housing.

2. An active radio frequency cavity amplifier as in claim 1, wherein said housing is cylindrically-shaped, wherein the at least one gap for the input cavity is an annular cavity encircling said input cavity and the at least one gap for the output cavity is an annular cavity encircling said output cavity.

3. An active radio frequency cavity amplifier as in claim 2, wherein said annular cavities are configured to act as RF chokes to prevent the amplified RF power from being short-circuited.

4. An active radio frequency cavity amplifier as in claim 1, wherein said housing is comprised of a conductive material.

5. An active radio frequency cavity amplifier as in claim 1, wherein said respective plunger assembly includes:
   a coupling capacitor including a conducting cylindrical plunger having a first end and a second end, at least one dielectric disc being coupled to said second end; and
   a coaxial section having a center conductor and a matching section disposed in a channel of said cylindrical plunger.

6. An active radio frequency cavity amplifier as in claim 1, wherein said plunger assembly of said first RF power coupling mechanism is configured for tuning a resonant frequency of said input cavity, and said plunger assembly of said second RF power coupling mechanism is configured for tuning a resonant frequency of said output cavity.

7. An active radio frequency cavity amplifier comprising:
   a housing defining an input cavity, an output cavity and at least one gap for each of the input and output cavities;
   a plurality of transistors mounted to said housing, each of said plurality of transistors having a respective input lead and a respective output lead;
   a first RF power coupling mechanism disposed within the housing in proximity to the input cavity for coupling RF power from a source into the input cavity to generate an RF field;
   a first conducting assembly having a plurality of conductors, each conductor configured to contact a respective input lead of the plurality of transistors for coupling the RF field in the input cavity to the respective input leads of the plurality of transistors via the at least one gap of the input cavity;
   a second conducting assembly having a plurality of conductors, each conductor configured to contact a respective output lead of the plurality of transistors for inducing an RF field in the output cavity from said plurality of transistors via the at least one gap of the output cavity; and
   a second RF power coupling mechanism disposed within the housing in proximity to the output cavity for coupling amplified RF power from the amplified RF field in the output cavity to a load, wherein said housing is cylindrically-shaped, wherein the at least one gap for the input cavity is an annular cavity encircling said input cavity and the at least one gap for the output cavity is an annular cavity encircling said output cavity, and wherein said annular cavities are configured to act as RF chokes to prevent the amplified RF power from being short-circuited.

8. A method for amplifying RF power comprising the steps of:
   coupling RF power to an active radio frequency cavity amplifier comprising a housing defining an input cavity, an output cavity and at least one gap for the input and output cavities and a plurality of transistors mounted in proximity to said input and output cavities and each of said plurality of transistors having and a respective input lead and a respective output lead;
   tuning the resonant frequency of the input cavity and the resonant frequency of the output cavity;
   coupling the RF field in the input cavity to the respective input leads of the plurality of transistors via the at least one gap of the input cavity;
   inducing an amplified RF field in the output cavity from the respective output leads of the plurality of transistors via the at least one gap of the output cavity; and
   coupling amplified RF power from the amplified RF field in the output cavity out of said active radio frequency cavity amplifier.

9. An RF power amplifier comprising:
   means for coupling RF power to an active radio frequency cavity amplifier comprising a housing defining an input cavity, an output cavity and at least one gap for the input and output cavities;
   means for coupling an RF field within the input cavity, wherein a plurality of transistors are mounted in proximity to said input and output cavities and each of said plurality of transistors having a respective input lead and a respective output lead; and
   means for coupling the RF field in the input cavity to the respective input leads of the plurality of transistors via the at least one gap of the input cavity;
   means for tuning the resonant frequency of the input cavity and the resonant frequency of the output cavity; and
   means, coupled to the output leads of the plurality of transistors, for inducing an amplified RF field in the output cavity, via the at least one gap of the output cavity.

10. An RF power amplifier as in claim 9, further comprising:
    means for coupling amplified RF power from the amplified RF field in the output cavity.

11. An RF power amplifier comprising:
    means for coupling RF power to an active radio frequency cavity amplifier comprising a housing defining an input cavity, an output cavity, and at least one gap for the input and output cavities;
    means for coupling an RF field within the input cavity, wherein a plurality of transistors are mounted in proximity to said at least one gap for the input and output cavities and each of said plurality of transistors having a respective input lead and a respective output lead; and
    means for tuning the resonant frequency of the input cavity and the resonant frequency of the output cavity.

12. An RF power amplifier as in claim 11, further comprising:
    means for coupling the RF field in the input cavity to the respective input leads of the plurality of transistors via the at least one gap of said input cavity and for exciting an amplified RF field in the output cavity from the output leads of the plurality of transistors via the at least one gap of the output cavity; and
    means for inducing an amplified RF power from the amplified RF field in the output cavity.

* * * * *